(12) United States Patent
Lee et al.

(10) Patent No.: US 7,257,891 B2
(45) Date of Patent: Aug. 21, 2007

(54) METHOD FOR FORMING BONDING PADS

(75) Inventors: Sung-Gue Lee, Gyeonggi-Do (KR); Yong-Il Kim, Incheon (KR)

(73) Assignee: LG Electronics Inc., Seoul (KR)

( * ) Notice: Subject to any disclaimer, the term of this patent is extended or adjusted under 35 U.S.C. 154(b) by 199 days.

(21) Appl. No.: 10/836,219

(22) Filed: May 3, 2004

(65) Prior Publication Data

US 2004/0200726 A1    Oct. 14, 2004

Related U.S. Application Data

(62) Division of application No. 10/291,606, filed on Nov. 12, 2002, now Pat. No. 6,740,352.

(30) Foreign Application Priority Data

Nov. 13, 2001  (KR) ............................... 2001-70511

(51) Int. Cl.
H05K 3/02 (2006.01)
H05K 3/10 (2006.01)

(52) U.S. Cl. .......................... 29/846; 29/830; 29/831; 29/843; 29/874; 174/257; 361/763; 438/612

(58) Field of Classification Search .................. 29/830, 29/831, 846–849, 851, 874; 174/257, 261; 257/693, 737–739, 778–786; 361/767–768, 361/783; 427/56, 96, 58; 438/112–115, 438/123, 612

See application file for complete search history.

(56) References Cited

U.S. PATENT DOCUMENTS

| 3,881,884 A | 5/1975 | Cook et al. |
|---|---|---|
| 4,081,601 A | 3/1978 | Dinella et al. |
| 4,109,297 A | 8/1978 | Lesh et al. ................... 361/765 |
| 4,289,575 A | 9/1981 | Matsumoto et al. .......... 216/13 |
| 4,910,094 A * | 3/1990 | Watanabe et al. ........... 427/123 |
| 5,118,386 A | 6/1992 | Kataoka et al. |
| 5,169,680 A | 12/1992 | Ting et al. ................... 438/629 |
| 5,733,466 A | 3/1998 | Benebo et al. ................ 216/13 |
| 6,015,482 A | 1/2000 | Stern .......................... 205/125 |
| 6,041,495 A * | 3/2000 | Yoon et al. ................... 29/841 |
| 6,045,713 A | 4/2000 | Tamiya et al. ................ 216/13 |
| 6,162,365 A | 12/2000 | Bhatt et al. |

(Continued)

FOREIGN PATENT DOCUMENTS

JP    05-183259    7/1993

(Continued)

OTHER PUBLICATIONS

Japanese Office Action dated Oct. 26, 2004.

*Primary Examiner*—Minh Trinh
*Assistant Examiner*—Donghai D. Nguyen
(74) *Attorney, Agent, or Firm*—Ked & Associates, LLP

(57) ABSTRACT

A method for forming bonding pads on a printed circuit board (PCB) with circuit patterns is provided. A plurality of copper patterns are formed on the PCB which are electrically connected to the circuit patterns, and a filler is filled between the copper patterns such that an upper surface of the copper pattern is exposed. A plating layer is then applied to the exposed upper surface of the copper patterns. Protrusion of the plating layer at a lower portion of a copper pattern is prevented, thus reducing an interval between the wire bonding pad(s) and potentially increasing the number of bonding pads which may be effectively formed on a given PCB.

19 Claims, 4 Drawing Sheets

U.S. PATENT DOCUMENTS

| | | | |
|---|---|---|---|
| 6,210,746 B1 | 4/2001 | Cheng | 427/96 |
| 6,249,053 B1 | 6/2001 | Nakata et al. | 257/738 |
| 6,333,252 B1 * | 12/2001 | Jung et al. | 438/612 |
| 6,334,942 B1 | 1/2002 | Haba et al. | |
| 6,398,935 B1 | 6/2002 | Downes | 205/81 |
| 6,517,893 B2 | 2/2003 | Abys et al. | 427/96 |
| 6,717,059 B2 | 4/2004 | Shintani et al. | 174/251 |
| 6,717,069 B2 | 4/2004 | Yoneda | 174/262 |
| 6,809,415 B2 * | 10/2004 | Tsukada et al. | 257/693 |

FOREIGN PATENT DOCUMENTS

| | | |
|---|---|---|
| JP | 10-012999 | 1/1998 |
| JP | 11-307678 | 11/1999 |

\* cited by examiner

METHOD FOR FORMING BONDING PADS

This aaplcation is a divisional application of U.S. patent application Ser. No. 10/291,606 filed Nov. 12, 2002, now U.S. Pat. No. 6,740,352.

BACKGROUND OF THE INVENTION

1. Field of the Invention

The invention relates to a printed circuit board (PCB), and more particularly, to bonding pad(s) for a printed circuit board for a semiconductor package and a method for forming bonding pad(s).

2. Background of the Related Art

In general, as multi-functional electronic devices increase in capacity and become more compact in size, semiconductor packets mounted in the electronic devices must become smaller. Accordingly, a semiconductor package in a ball grid array (BGA) form has been developed which is utilized by attaching solder balls at an upper surface of the printed circuit board of the semiconductor package, in place of outer leads emanating from a semiconductor package. This type of conventional semiconductor package will now be described with reference to FIG. 1.

FIG. 1 is a schematic plan view of a printed circuit board used for fabrication of a semiconductor package in a BGA form in accordance with a conventional art. As shown in FIG. 1, an assembly of a printed circuit board (PCB) 1 includes a cavity 2 formed at the center of the PCB 1 to accommodate a semiconductor chip (not shown) thereon, bonding pads 3 formed at an outer side of the cavity 2 and connected to the semiconductor chip by, for example, gold wire (not shown), and a plurality of external terminal lands (that is, ball bump lands in this case) 4 formed at an exterior of the bonding pads 3 and connected to a circuit pattern (not shown) formed inside the PCB 1.

In assembling the semiconductor package, the semiconductor chip is inserted and attached into the cavity 2 formed at the center of the PCB 1. The attached semiconductor chip and the bonding pads 3 are connected by the gold wire (not shown), whereby the semiconductor chip and the PCB 1 are electrically connected. Thereafter, in order to protect the semiconductor chip, the semiconductor chip and the wire are molded using an epoxy compound.

The bonding pads 3 will now be described with reference to FIG. 2.

FIG. 2 is an enlarged schematic view of bonding pads in accordance with the conventional art. As shown in FIG. 2, the bonding pads 3 are exposed externally, and a photo solder resist (PSR) 6 is applied on the circuit patterns 5 connected to the bonding pads 3. The PSR 6 is applied to protect the circuit pattern 5.

The bonding pads 3 will now be described in detail with reference to FIG. 3.

FIG. 3 is a schematic sectional view taken along line A-A' of FIG. 2. As shown in FIG. 3, the bonding pad 3 includes an insulation layer 7 applied at an upper surface of the PCB 1, a copper pattern 8 formed at an upper surface of the insulation layer 7, and a nickel plating layer 9 and a gold plating layer 10 sequentially formed on the upper surface of the copper pattern 8.

The copper pattern 8 is formed by removing an unnecessary portion of copper clad laminate (CCL). The CCL is formed by attaching copper foil at one or both sides of the PCB 1 with the insulation layer 7 formed therein and using a general etching process, which will now be described in detail.

First, the copper foil is attached at an upper surface of the insulation layer 7 by using an adhesive 12. In order to increase the strength of the adhesive, the surface of the insulation layer 7 is made rough. A concave-convex portion 11 is formed at a lower surface of the copper foil. In order to increase attachment strength, a chromium (Cr) film 13 is applied on the surface of the concave-convex portion 11. The copper foil is then attached on the upper surface of the insulation layer 7 using the adhesive 12.

Thereafter, the nickel plating layer 9 and the gold plating layer 10 are sequentially formed on the upper surface of the copper pattern 8, thereby completing the bonding pad 3.

However, in removing the copper foil using the etching process to form the bonding pad 3 according to the conventional art, the chrome component remains at the left and right lower portions of the copper pattern 8. That is, the remaining chrome component protrudes from the left and right lower portions of the copper pattern 8. When the nickel plating layer 9 and the gold plating layer 10 are sequentially formed on the copper pattern 8, the nickel plating layer 9 and the gold plating layer 10 are formed so that they cover the outer side of the copper pattern 8 on the upper surface and at both side faces of the copper pattern 8.

However, the nickel plating layer 9 and the gold plating layer 10 are also sequentially formed on the surface of the chromium, which protrudes at the base of the bonding pad 3 as indicated by 'L' in FIG. 3.

Thus, since the nickel plating layer 9 and the gold plating layer 10 are formed protruded at both the left and right lower portions of the copper pattern 8, the space between adjacent bonding pads 3 becomes narrow, so that there is a limitation to accomplishing a fine pitch of the bonding pad 3.

For example, since the plating layers 9 and 10 are not formed protruded at the upper left and right portion of the copper pattern 8, the pitch interval between the adjacent wire bonding pads can be reduced. But when it comes to the lower portion of the copper pattern 8, since the distance between the left and right lower portions of the adjacent copper patterns 8 is narrower than the distance between the left and right upper portions of the copper patterns 8, it is not possible to reduce the interval between adjacent bonding pads.

As described above, the bonding pad of the PCB for a semiconductor package in accordance with the conventional art has the problem that, as the nickel plating layer 9 and the gold plating layer 10 are formed on the surface of the remaining chrome that protrudes from the left and right lower sides of the copper pattern 8 formed inside the bonding pad, it is not possible to reduce the interval between adjacent bonding pads.

SUMMARY OF THE INVENTION

An object of the invention is to substantially solve at least one or more of the above problems and/or disadvantages in whole or in part and to provide at least the advantages described herein.

Another object of the invention is to provide bonding pad(s) for a printed circuit board (PCB) and a method of forming bonding pad(s) capable of reducing the interval between wire bonding pads by preventing a nickel plating layer and a gold plating layer from protruding at the lower portion of a copper pattern when they are formed on the copper pattern.

To achieve at least these and other advantages of the invention, in whole or in part, and in accordance with the purpose of the invention, as embodied and broadly described herein, there is provided bonding pad(s) according to an embodiment of the invention formed on a printed circuit board with circuit patterns. The bonding pads include a plurality of copper patterns formed on the PCB and electrically connected to the circuit patterns, a filler filled at a space between the copper patterns such that an upper surface of the copper pattern is exposed, and a plating layer applied at an upper surface of the copper patterns.

To further achieve at least these and other advantages of the invention, in whole or in part, and in accordance with the purpose of the invention, as embodied and broadly described herein, there is also provided a method according to an embodiment of the invention for forming bonding pad(s) on a PCB, with a plurality of circuit patterns. The method includes forming a plurality of copper patterns electrically connected with the circuit patterns on the PCB, filling the space between the copper patterns with a filler such that upper surfaces of the copper patterns are exposed, and applying a plating layer on the upper surface of the copper patterns.

To further achieve at least these and other advantages of the invention, in whole or in part, and in accordance with the purpose of the invention, as embodied and broadly described herein, there is also provided a plurality of bonding pads formed on a printed circuit board (PCB), including a substrate having circuit patterns formed thereon, including a plurality of copper patterns formed on the substrate and electrically connected to the circuit patterns, a filler filled in spaces between the copper patterns such that upper surfaces of the copper patterns are exposed, and a plating layer applied to upper surfaces of the copper patterns.

To further achieve at least these and other advantages of the invention, in whole or in part, and in accordance with the purpose of the invention, as embodied and broadly described herein, there is also provided a method for forming a plurality of bonding pads on a printed circuit board (PCB) having a plurality of circuit patterns, the method including forming a plurality of copper patterns on a substrate, the copper patterns being electrically connected with the circuit patterns on the PCB, filling a filler at spaces between the copper patterns such that upper surfaces of the copper patterns are exposed, and applying a plating layer to upper surfaces of the copper patterns.

To further achieve at least these and other advantages of the invention, in whole or in part, and in accordance with the purpose of the invention, as embodied and broadly described herein, there is also provided a method for forming a plurality of bonding pads on a printed circuit board (PCB) having a plurality of circuit patterns, the method including forming a plurality of copper patterns on a substrate, the copper patterns being electrically connected with the circuit patterns on the PCB, filling a filler at spaces between the copper patterns such that upper surfaces of the copper patterns are exposed, plating a nickel plating layer on the exposed upper surfaces of the copper patterns, and plating a gold plating layer on the nickel plating layer, wherein widths of the nickel plating layer and the gold plating layer are smaller than a width of the copper patterns.

To further achieve at least these and other advantages of the invention, in whole or in part, and in accordance with the purpose of the invention, as embodied and broadly described herein, there is also provided a bonding pad formed on a printed circuit board (PCB), including a substrate having at least one circuit pattern formed thereon, including at least one copper pattern formed on the substrate and electrically connected to at least one circuit pattern, filler filled in on either side of at least one copper pattern up to a height substantially level with an upper surface of the copper pattern such that the upper surface of the copper pattern is exposed, and a plating layer applied at the upper surface of the at least one copper pattern.

To further achieve at least these and other advantages of the invention, in whole or in part, and in accordance with the purpose of the invention, as embodied and broadly described herein, there is also provided a method for forming a bonding pad on a printed circuit board (PCB) having at least one circuit pattern formed thereon, the method including forming at least one copper pattern on a substrate, the at least one copper pattern being electrically connected with the circuit pattern on the PCB, filling a filler in on either side of the copper pattern up to a height substantially level with an upper surface of the copper pattern such that the upper surface of the copper pattern is exposed, and applying a plating layer to the upper surface of the copper pattern.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to preferred embodiments of the invention, examples of which are illustrated in the accompanying drawings.

Bonding pad(s) of a printed circuit board (PCB) in accordance with an embodiment of the invention are formed by forming a plurality of copper patterns at an upper surface of an insulation layer formed on the PCB, filling a filler between the copper patterns such that upper surfaces of the copper patterns are exposed, forming a nickel plating layer on the surface of the copper patterns, and then forming a gold plating layer on the nickel plating layer, so that the nickel plating layer and the gold plating layer formed on the upper surface of the copper do not protrude from the lower side portions of the copper patterns, thereby reducing an interval between the bonding pads.

The bonding pad(s) of a PCB and a forming method in accordance with the embodiments of the invention will now be described with reference to FIGS. 4A through 5.

Figure 1:
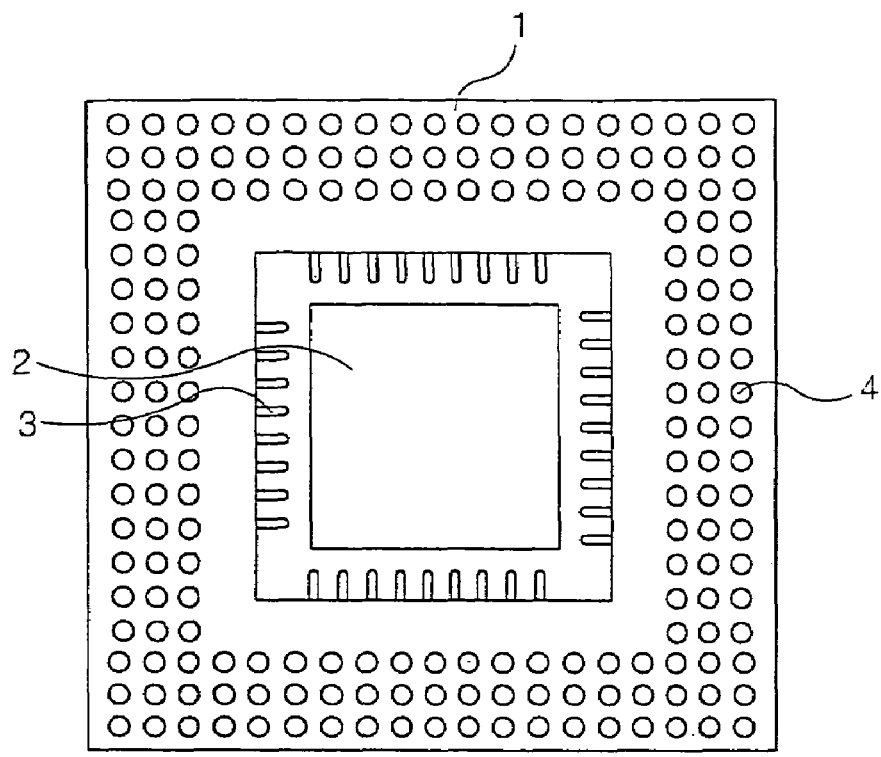
FIG. 1 is a schematic plan view of a printed circuit board (PCB) used for fabrication of a semiconductor package in a ball grid array (BGA) in accordance with a conventional art.
Figure 2:
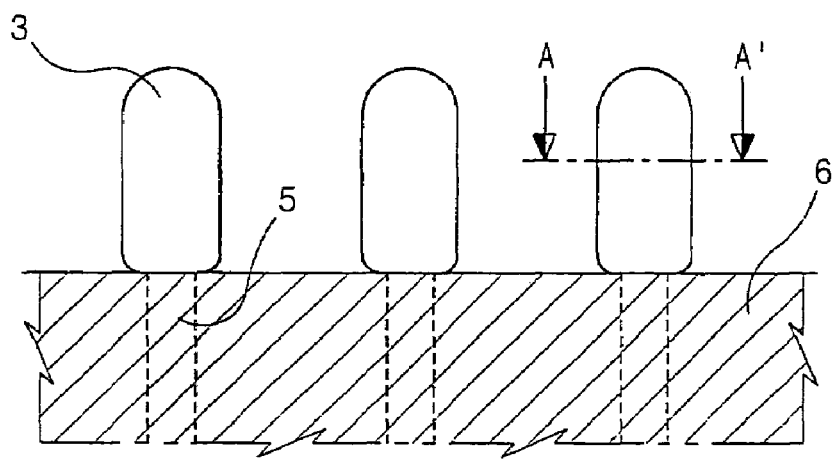
FIG. 2 is an enlarged schematic view of bonding pad(s) in accordance with the conventional art.
Figure 3:
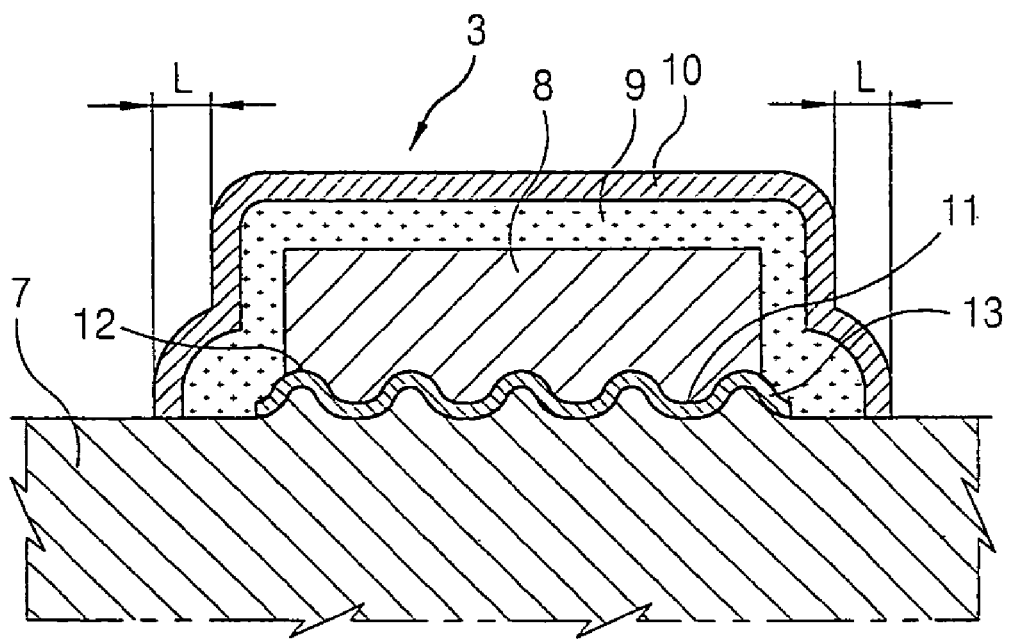
FIG. 3 is a schematic sectional view taken along line A-A' of FIG. 2.
Figure 4A:
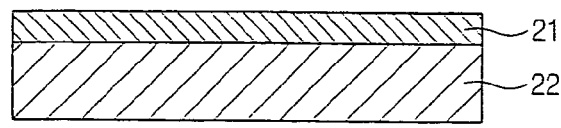
FIGS. 4A through 4E are schematic drawings showing a sequential process for forming bonding pad(s) on a printed circuit board assembly for fabricating a semiconductor package in accordance with an embodiment of the invention.

As shown in FIG. 4A, a copper foil 21 is formed on an insulation layer 22. In one embodiment, a copper clad laminate (CCL) is used for the copper foil 21.

Figure 4B:
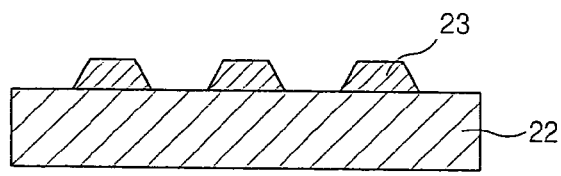

Next, as shown in FIG. 4B, the copper foil 21 formed on the insulation layer 22 is etched using an etching process to form patterns which include copper patterns (or a copper pads) 23 and circuit patterns 41. The copper patterns 23 are formed in the same manner as in the conventional art; however, according to one embodiment of the invention, the copper patterns 23 are formed in a trapezoid shape. Other shapes may also be appropriate. That is, when an etching solution infiltrates into the copper foil 21 in order to remove unnecessary portions of the copper foil 21, the upper portion of the copper foil 21 is in contact with the etching solution for a longer time period compared with the lower portion of the copper foil 21. Thus, the upper portion of the copper patterns 23 is formed with a smaller width than the lower portion thereof, so that its shape resembles a trapezoid. The phenomenon of forming the trapezoid is generally called an etching factor, which refers to an etching ratio between the upper portion and the lower portion of the copper pattern 23.

Figure 4C:
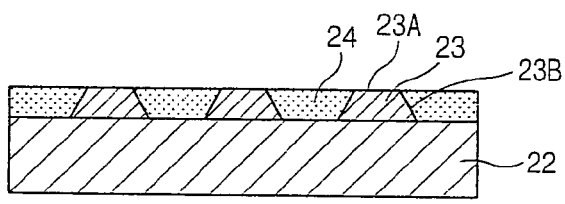

Thereafter, as shown in FIG. 4C, a filler 24 is filled in between the side surfaces 23b of the copper patterns 23 up to the upper surface 23a of the copper patterns 23. An infrared cured ink or a solder-resist, for example, a photo solder resist (PSR) may be used for the filler 24. For example, after the infrared cured ink is cured, it has a hardness stronger than that of the PSR. Thus, the infrared cured ink may be used for a high grade product.

The method for filling the filler 24 between the sides of the copper patterns 23 is disclosed in Korean Patent Application Nos. 2001-31752 and 2001-51853, which corresponds to U.S. patent application Ser. No. 10/043,146, which are assigned to the same entity as the present application. The disclosure of U.S. application Ser. No. 10/043,146. now U.S. Pat. No. 6,954,985, is hereby incorporated by reference. The filler 24 is filled between the sides 23b of the copper patterns 23 by directly contacting a squeegee with the upper surfaces 23a of the copper patterns 23. Using this method prevents generation of air bubbles inside the filler 24 and makes it possible to completely fill the space between the sides 23b of the copper patterns 23 with the filler 24 as high as the upper surface 23a of the copper patterns 23.

Thereafter, the upper surface 23a of the copper patterns 23 and the surface of the filler 24 are cleansed. Then, a process for smoothing the surface or giving the surface a suitably smooth or planar finish can be performed thereon as necessary. That is, the space between the sides 23b of the copper patterns 23 is filled with the filler 24 and sealed, so that only the upper surface 23a of the copper patterns 23 is exposed.

Thereafter, an electro-nickel gold plating process is performed on the copper patterns 23. When the electro-nickel gold plating process is performed, a nickel plating layer and/or a gold plating layer is formed on the exposed upper surface 23a of the copper patterns 23. This will now be described with reference to FIGS. 4D and 4E.

Figure 4D:
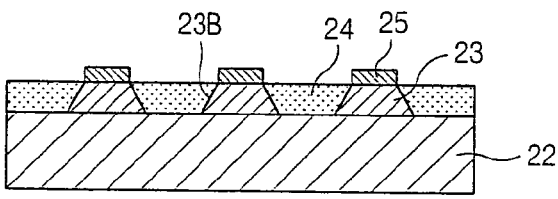

As shown in FIG. 4D, when the electro-nickel and/or gold plating is performed, the nickel molecules of the electro-solution are first plated on the copper patterns 23, so that the nickel plating layer 25 is formed on the exposed upper surface 23a of the copper patterns 23. At this time, since the filler 24 is an insulation material, the nickel plating layer 25 is not formed on the surface of the filler 24.

Figure 4E:
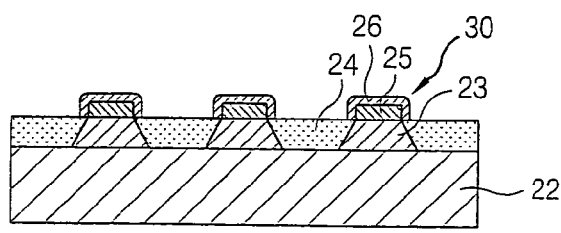

As shown in FIG. 4E, after the nickel plating layer 25 is plated on the exposed upper surface 23a of the copper pattern 23, the gold plating layer 26 is plated on the surface of the nickel plating layer 25, thereby completing the bonding pad 30. Again, since the filler 24 is an insulation material, the gold plating layer 26 is not formed on the surface of the filler 24. Further, since the side 23b of the copper pattern is covered by the filler 24 and only the upper surface 23a of the copper pattern 23 is exposed, the nickel plating layer 25 is formed only on the upper surface 23a of the copper pattern 23, and the gold plating layer 26 is formed on the entire exposed surface of the nickel plating layer 25.

It is noted that the gold plating layer 26 will be connected to a gold wire connected to the semiconductor chip after mounting the semiconductor chip thereon. Thus, the gold plating layer 26 formed at the side of the nickel plating layer 25 is formed as thin as possible. The nickel plating layer 25 may be formed with a thickness of about 3~7 µm, and the gold plating layer 26 may be formed with a thickness of about 0.5 µm.

Thus, the gold plating layer 26 is formed larger than the upper end portion of the copper pattern 23 or the width of the nickel plating layer 25. However, since the width of the gold plating layer 26 formed at the sides of the nickel plating layer 25 is smaller or the same as the width of the lower end portion of the copper pattern 23, the interval between the adjacent bonding pads 3 can be reduced.

Figure 5:
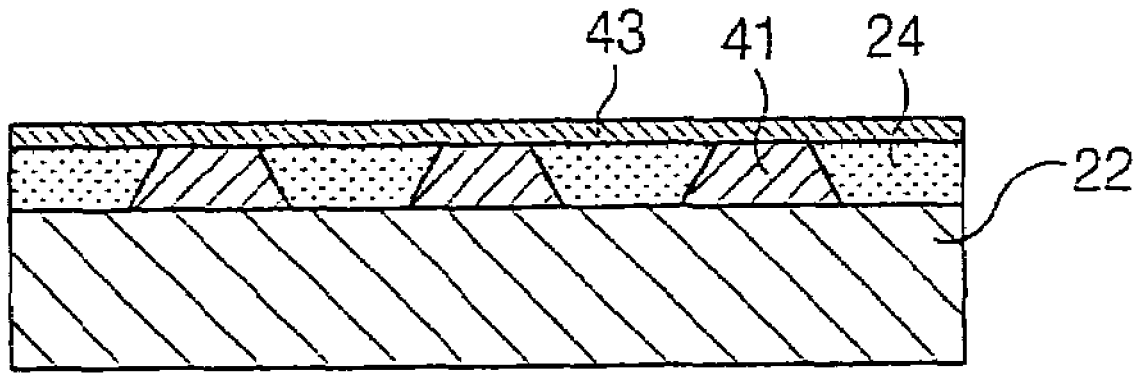
FIG. 5 is a schematic sectional view illustrating a filler filled between circuit patterns of the printed circuit board assembly in accordance with an embodiment of the invention.

FIG. 5 is a schematic sectional view illustrating a filler filled between circuit patterns 41 of the printed circuit board assembly in accordance with an embodiment of the invention. This is in contrast with FIG. 4E, which only shows the portions of the patterns formed by the copper foil 21 which constitute the bonding pads 23. As previously stated, such portions extend from the bonding pads 23 to form the circuit patterns 41. As shown in FIG. 5, when the filler 24 is filled between the copper patterns 23, if the filler 24 is also filled between the circuit patterns 41 up to an upper surface of the circuit patterns 41, a passivation film (PSR) 43 may be smoothly applied to the upper surface of the circuit pattern 41 prior to the plating process to protect the circuit pattern 41.

The passivation layer 43 is applied on the circuit pattern 41 before proceeding to the plating process of figures 4D-4E so that the nickel and gold plating layers do not contact the circuit pattern 41. Since the filler 24 is applied to the same height as that of the circuit pattern 41 the passivation layer 43 is uniformly applied on the circuit pattern 41 and the filler 24. Further, a polishing process to level the height of the applied passivation layer 43 can be omitted.

As so far described, the bonding pad(s) of a printed circuit board and the method of forming the bonding pad(s) according to the invention have at least the following advantages, as well as others.

That is, the semiconductor chip is mounted on a completed printed circuit board, and is then sealed with an epoxy molding compound and cured, so that the filler is hardened in a state of being fully filled in at left and right sides of the copper patterns and the circuit patterns, thereby firmly supporting the copper patterns and the circuit patterns. Thus, even if there is a change in a thermal cycle, and a series of high and low temperatures are repeated, a crack possibly caused by differences in coefficients of thermal expansion (CTE) between the epoxy molding compound and the insulation layer of the printed circuit board can be prevented.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for forming a plurality of bonding pads on a printed circuit board (PCB) having a plurality of circuit patterns, comprising:
    forming a plurality of copper patterns on a substrate, the plurality of copper patterns being electrically connected with the plurality of circuit patterns on the PCB;
    filling a filler at spaces formed between the copper patterns;
    flattening an upper surface of the filler such that upper surfaces of the plurality of copper patterns are exposed; and
    applying a plating layer to only the exposed upper surfaces of the plurality of copper patterns,
    wherein the applying the plating layer comprises applying a nickel plating layer to exposed top surfaces of the plurality of copper patterns but not to the side surfaces of the copper patterns and forming a gold plating layer on both side faces and top surfaces of the nickel plating layer formed on the copper patterns.

2. The method of claim 1, wherein an etching factor is applied when forming the copper patterns, resulting in copper patterns with cross sections that are substantially trapezoidal in cross section.

3. The method of claim 1, wherein a width of the plating layers are less than or substantially equal to a width of the copper patterns.

4. The method of claim 1, wherein a thickness of the gold plating layer is less than a thickness of the nickel plating layer.

5. The method of claim 1, wherein the filler is one of an infrared cured ink and/or a solder-resist.

6. The method of claim 1, wherein flattening an upper surface of the filler such that upper surfaces of the plurality of copper patterns are exposed comprises flattening the upper surface of the filler such that the filler substantially completely covers side surfaces of the plurality of copper patterns, leaving only top surfaces of the copper patterns exposed.

7. A method for forming a plurality of bonding pads on a printed circuit board (PCB) having a plurality of circuit patterns, comprising:
    forming a plurality of copper patterns on a substrate;
    thereafter filling a filler at spaces formed between adjacent copper patterns;
    flattening an upper surface of the filler such that upper surfaces of the plurality of copper patterns are exposed and the filler remains in the spaces formed between adjacent copper patterns; and
    applying a plating layer to only the upper surfaces of the plurality of copper patterns,
    wherein the applying the plating layer further comprises applying a nickel plating layer to exposed top surfaces of the plurality of copper patterns but not to the side surfaces of the plurality of copper patterns and forming a gold plating layer on both side surfaces and a top surface of the nickel plating layer.

8. The method of claim 7, wherein forming the plurality of copper patterns on a substrate further comprises applying an etching factor to the plurality of copper patterns.

9. The method of claim 8, wherein applying an etching factor to the plurality of copper patterns produces copper patterns with cross sections that are substantially trapezoidal in shape.

10. The method of claim 7, wherein a width of the plating layers are less than or equal to a width of the plurality of copper patterns.

11. The method of claim 7, wherein the gold plating layer is formed thinner than the nickel plating layer.

12. The method of claim 7, wherein the filler is one of an infrared cured ink and/or a solder-resist.

13. The method of claim 7, wherein flattening an upper surface of the filler comprises flattening the upper surface of the filler such that the filler substantially completely covers side surfaces of the plurality of copper patterns, leaving only top surfaces of the copper patterns exposed.

14. A method for forming a bonding pad on a printed circuit board (PCB) having a plurality of circuit patterns, comprising:
    forming a copper pattern on a substrate;
    filling a filler at a space formed adjacent the copper pattern;
    flattening an upper surface of the filler such that an upper surface of the copper pattern is exposed; and
    applying a plating layer to only the upper surface of the copper pattern,
    wherein the applying the plating layer comprises applying a nickel plating layer to an exposed top surface of the copper pattern but not to the side surfaces of the copper pattern and forming a gold plating layer on both side surfaces and a top surface of the nickel plating layer.

15. The method of claim 14, further comprising applying an etching factor when forming the copper pattern which results in a copper pattern with a substantially trapezoidal cross section.

16. The method of claim 14, wherein a width of the plating layer are less than or equal to a width of the copper pattern.

17. The method of claim 14, wherein the gold plating layer is formed thinner than the nickel plating layer.

18. The method of claim 14, wherein the filler is one of an infrared cured ink and/or a solder-resist.

19. The method of claim 14, wherein flattening an upper surface of the filler such that an upper surface of the copper pattern is exposed comprises flattening the upper surface of the filler such that the filler substantially completely covers side surfaces of the copper pattern, leaving only a top surface of the copper pattern exposed.

* * * * *